United States Patent
Deshpande et al.

(10) Patent No.: US 12,327,591 B2
(45) Date of Patent: Jun. 10, 2025

(54) METHOD AND APPARATUS FOR PERFORMING A MAC OPERATION IN A MEMORY ARRAY

(71) Applicant: MEDIATEK Singapore Pte. Ltd., Singapore (SG)

(72) Inventors: Chetan Deshpande, San Jose, CA (US); Gajanan Sahebrao Jedhe, San Jose, CA (US); Cheng-Xin Xue, Hsinchu (TW); Zijie Guo, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 76 days.

(21) Appl. No.: 17/709,183

(22) Filed: Mar. 30, 2022

(65) Prior Publication Data

US 2022/0328099 A1 Oct. 13, 2022

Related U.S. Application Data

(60) Provisional application No. 63/172,759, filed on Apr. 9, 2021.

(51) Int. Cl.
*G11C 15/00* (2006.01)
*G06F 7/50* (2006.01)
(Continued)

(52) U.S. Cl.
CPC .............. *G11C 15/04* (2013.01); *G06F 7/50* (2013.01); *G06F 7/523* (2013.01); *G11C 11/412* (2013.01)

(58) Field of Classification Search
CPC ..... G11C 15/04; G11C 11/412; G11C 15/043; G11C 11/413; G11C 5/02; G11C 5/06;
(Continued)

(56) References Cited

U.S. PATENT DOCUMENTS 6,005,813 A 12/1999 Waller
7,355,873 B2 * 4/2008 Nii .................. G11C 15/04
365/49.1
(Continued)

FOREIGN PATENT DOCUMENTS

WO 2019/246064 A1 12/2019

OTHER PUBLICATIONS

Extended European Search Report for European Application No. 22167242.1 dated Sep. 7, 2022.
(Continued)

*Primary Examiner* — Tha-O H Bui

(74) *Attorney, Agent, or Firm* — Winston Hsu

(57) ABSTRACT

Aspects of the present disclosure are directed to devices and methods for performing MAC operations using a TCAM array as a compute-in-memory (CIM) device that can enable higher computational throughput, higher performance and lower energy consumption compared to computation using a processor outside of a memory array. In some embodiments, weights in a weight matrix may be programmed in SRAMs of a TCAM bit cell array. Each SRAM may operate as a multiplier that performs a multiplication between the stored weight to an input activation value applied at a search line in the TCAM bit cell array. The two SRAMs within a TCAM bit cell may operate independently to receive independently two input activation values on their respective select lines, and to perform a multiplication operation with the stored weight in each respective SRAM.

20 Claims, 13 Drawing Sheets

(51) Int. Cl.
*G06F 7/523* (2006.01)
*G11C 11/412* (2006.01)
*G11C 15/04* (2006.01)

(58) Field of Classification Search
CPC .......... G06F 7/50; G06F 7/523; G06F 7/5443; G06F 7/575
USPC ...................................................... 365/49.11
See application file for complete search history.

(56) References Cited

U.S. PATENT DOCUMENTS

| | | | |
|---|---|---|---|
| 9,286,980 B2 * | 3/2016 | Arsovski | G11C 15/046 |
| 9,543,015 B1 * | 1/2017 | Roy | G11C 15/04 |
| 9,564,184 B2 * | 2/2017 | Barth, Jr. | G11C 7/067 |
| 10,534,839 B2 * | 1/2020 | Hsieh | H03M 7/3082 |
| 10,621,489 B2 * | 4/2020 | Appuswamy | G06N 3/045 |
| 11,018,687 B1 | 5/2021 | Srivastava | |
| 11,049,013 B1 | 6/2021 | Duong | |
| 2004/0199724 A1 | 10/2004 | Jalowiecki et al. | |
| 2010/0271854 A1 | 10/2010 | Chu | |
| 2013/0135914 A1 | 5/2013 | Kohli | |
| 2015/0131383 A1 | 5/2015 | Akerib | |
| 2019/0102671 A1 | 4/2019 | Cohen | |
| 2020/0258569 A1 | 8/2020 | Jaiswal | |
| 2020/0301668 A1 | 9/2020 | Li | |
| 2020/0403616 A1 | 12/2020 | Shu | |
| 2021/0012202 A1 * | 1/2021 | Venkatesh | G06F 7/556 |
| 2021/0027815 A1 | 1/2021 | Shu | |
| 2021/0240442 A1 | 8/2021 | Srivastava | |
| 2021/0350846 A1 | 11/2021 | Rios | |
| 2022/0044714 A1 | 2/2022 | Chang | |
| 2022/0301605 A1 | 9/2022 | Mirhaj | |
| 2023/0022347 A1 | 1/2023 | Deshpande | |
| 2023/0307017 A1 | 9/2023 | Jedhe | |

OTHER PUBLICATIONS

Extended European Search Report for European Application No. 22185165.2 dated Dec. 12, 2022.
Yue et al., 14.3 A 65nm computing-in-memory-based CNN processor with 2.9-to-35.8 TOPS/W system energy efficiency using dynamic-sparsity performance-scaling architecture and energy-efficient inter/intra-macro data reuse. 2020 IEEE International Solid-State Circuits Conference—(ISSCC) Feb. 16, 2020:234-6.
U.S. Appl. No. 18/175,511, filed Feb. 27, 2023, Jedhe et al.
EP 22185165.2, Dec. 12, 2022, Extended European Search Report.
U.S. Appl. No. 17/852,193, filed Jun. 28, 2022, Deshpande et al.
EP 22167242.1, Sep. 7, 2022, Extended European Search Report.
Jinshan Yue et al., "A 65nm Computing-in-Memory-Based CNN Processor with 2.9-to-35.8TOPS/W System Energy Efficiency Using Dynamic-Sparsity Performance-Scaling Architecture and Energy-Efficient Inter/Intra-Macro Data Reuse", ISSCC 2020 / Session 14 / Low-Power Machine Learning / 14.3, Feb. 18, 2020, XP033754392, pp. 234~236, 2020 IEEE International Solid-State Circuits Conference. , Feb. 18, 2020.

* cited by examiner

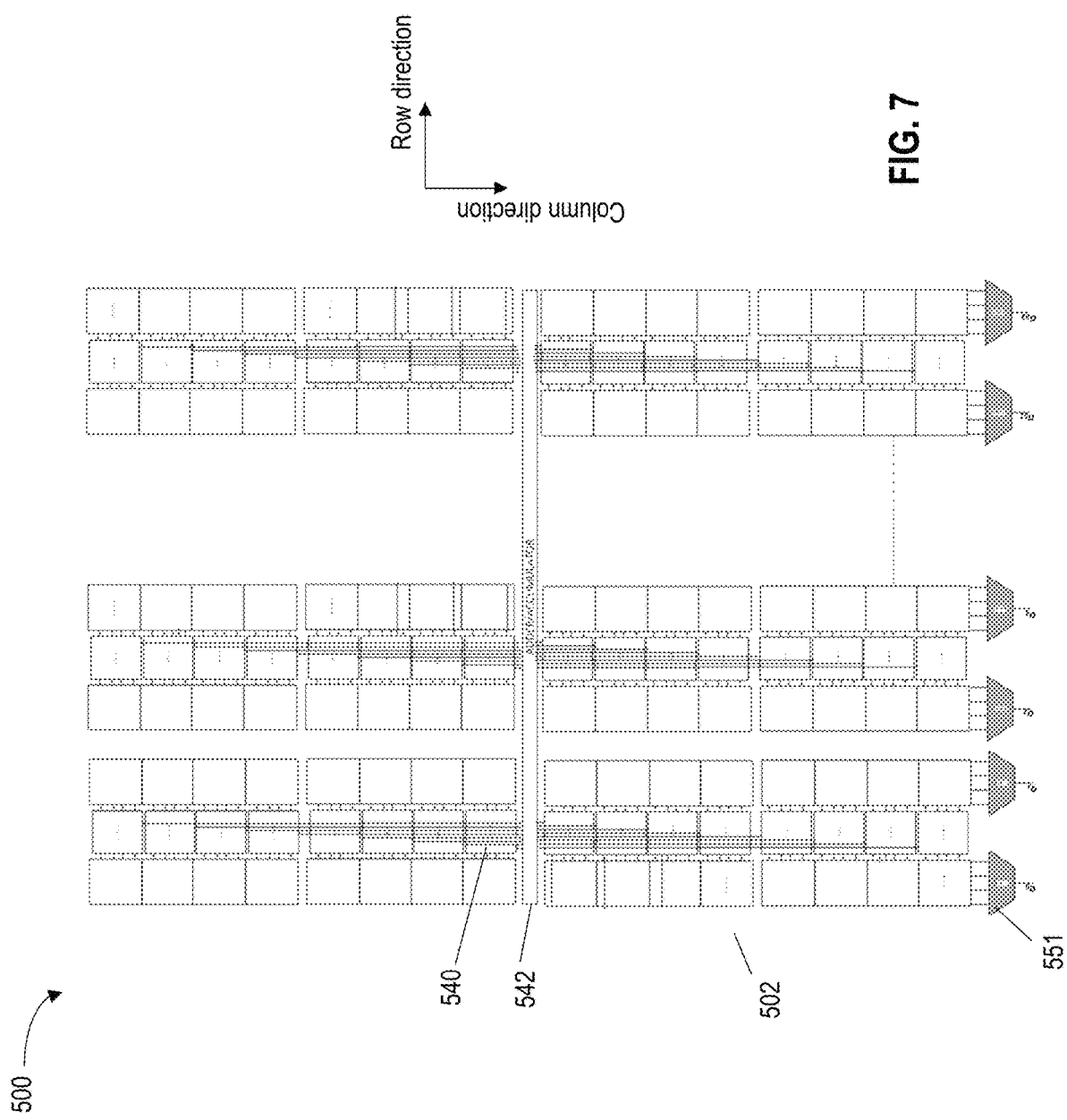

METHOD AND APPARATUS FOR PERFORMING A MAC OPERATION IN A MEMORY ARRAY

CROSS-REFERENCE TO RELATED APPLICATIONS

This application claims the benefit of U.S. Provisional Application Ser. No. 63/172,759, filed on Apr. 9, 2021, and entitled "METHOD AND APPARATUS FOR PERFORMING A MAC OPERATION IN A MEMORY ARRAY USING A 16-T MEMORY CELL," which is hereby incorporated herein by reference in its entirety.

FIELD OF THE DISCLOSURE

This application is generally related to a compute-in-memory (CIM) device, and in particular, related to a CIM device that can perform multiply and accumulate (MAC) operations.

BACKGROUND

Deep learning, machine learning, neural networks, and other matrix-based differentiable programs are used to solve a variety of problems, including natural language processing and object recognition in images. Solving these problems typically involves performing computation based on a matrix-vector multiplication. For example, in a neural network having multiple neurons, input activation values to the neurons may be viewed as an input activation vector, and output activation values from the neurons may be viewed as an output activation vector. The computation of this neural network typically involves a matrix-vector multiplication of the input activation vector with a weight matrix to calculate the output activation vector. In general, a weight matrix can be rectangular and the length of the output activation vector is not necessarily identical from the length of the input activation vector. Computation of a neural network typically involves computation with multiply and accumulate (MAC) operations performed on data values including input/output activation vectors and weights. A MAC operation refers to multiplication between two values, and the subsequent accumulation of results from a sequence of multiplications to provide an output MAC value.

The computation of large and deep neural networks involves massively parallel computation of many different data values. The computation operation such as arithmetic or logic typically is carried out by a processor based on transfer of data between the processor and memory devices such as a memory array. As data throughput requirement increases for massively parallel neural networks, the slower transfer of data of a fast processor with the memory may sometimes become a bottleneck for machine learning applications.

Content-addressable memory (CAM) is a type of computer memory that is designed for search-intensive applications. Because of its parallel nature, CAMs are much faster than random access memory (RAM) architectures for searching. CAMs are often used in internet routers and switches, where they increase the speed of route look-up, packet classification and packet forwarding. Ternary CAMs, or TCAMs, are designed to store and query data using three different inputs: 0, 1 and X. The "X" input, which is often referred to as a "don't care" or "wildcard" state, enables TCAMs to perform broader searches based on pattern matching, as opposed to binary CAM, which performs exact-match searches using only 0s and 1s.

SUMMARY OF THE DISCLOSURE

Some embodiments relate to a compute-in-memory device that comprises a memory array comprising a plurality of ternary content-addressable memory (TCAM) bit cells arranged in a plurality of rows. Each TCAM bit cell comprises two static random-access memories (SRAMs), each SRAM configured to apply a weight stored therein to an input activation to generate an output value; and a plurality of activation lines, each activation line interconnecting a row of the plurality of rows of TCAM bit cells and configured to receive output values from both SRAMs in each TCAM bit cell within the row.

Some embodiments relate to a method for operating a ternary content-addressable memory (TCAM) cell array to perform a multiply-and-accumulate (MAC) operation of a vector of input activations with a matrix of weights. TCAM cells in the TCAM cell array are arranged in a plurality of rows and each comprising two static random-access memories (SRAMs). The method comprises storing the weights in the SRAMs within the TCAM cell array; multiplying, with the SRAMs, the vector of input activations to the weights to produce a plurality of output values; collecting output values from both SRAMs in each TCAM cell of a row of the plurality of rows with an activation line; and summing the output values from the activation line to generate a MAC value.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings:

FIG. 3B is broken into partial views FIG. 3B-1 and FIG. 3B-2 drawn on two separate sheets. The partial views FIG. 3B-1 and FIG. 3B-2 are arranged such that a single complete view of FIG. 3B may be assembled by linking edge to edge the lines labeled with a circled capital letter (such as Â, B̂ . . . etc.).

FIG. 5 is broken into partial views FIG. 5-1 and FIG. 5-2 drawn on two separate sheets. The partial views FIG. 5-1 and FIG. 5-2 are arranged such that a single complete view of FIG. 5 may be assembled by linking edge to edge the lines labeled with a circled capital letter (such as Â, B̂ . . . etc.).

FIG. 6 is broken into partial views FIG. 6-1 and FIG. 6-2 drawn on two separate sheets. The partial views FIG. 6-1 and FIG. 6-2 are arranged such that a single complete view of FIG. 5 may be assembled by linking edge to edge the lines labeled with a circled capital letter (such as Â).

FIG. 7 is a schematic diagram of another variation of a CIM device having a continuous tile architecture, in accordance with a fifth embodiment.

DETAILED DESCRIPTION

Figure 1:
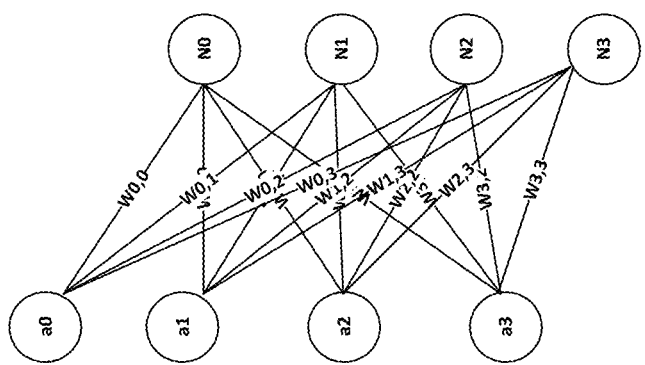
FIG. 1 is a schematic diagram of an exemplary neural network representation illustrating a MAC operation that may be performed using the CIM device disclosed herein.

Disclosed herein are devices and methods for performing MAC operations using a TCAM array as a compute-in-memory (CIM) device. CIM or in-memory computation is a technique of performing calculations on data using internal circuitry within a memory array without having to send such data to a processor, which can enable higher computational throughput and higher performance compared to computation using a processor outside of a memory array. Because data movement between an external processor and the memory is reduced, CIM may also reduce energy consumption.

Some embodiments are directed to a CIM device that includes an array of TCAM bit cells arranged in rows and columns. Each TCAM bit cell has two static random-access memories (SRAMs). Weights in a weight matrix may be stored as charges in each SRAM of the TCAM bit cells. Each SRAM may operate as a multiplier that performs a multiplication between the stored weight to an input activation value applied at a search line in the TCAM bit cell array. The two SRAMs within a TCAM bit cell may operate independently to receive independently two input activation values on their respective select lines, and to perform a multiplication operation with the stored weight in each respective SRAM.

In some embodiments, TCAM bit cells within a same row are interconnected together with an activation line to receive the output values as a result of the multiplications performed by SRAMs within the row of TCAM bit cells. Summing for the MAC operation is provided by an adder tree that is coupled to the activation line. In some embodiments, each row of the TCAM bit cells is provided with a corresponding activation line to receive output multiplication values from the TCAM bit cells from the row. The activation lines are coupled to the adder tree for the MAC operation.

According to an aspect of the present disclosure, because an activation line for a row of TCAM cells is intersecting select lines that runs in a column direction for the TCAM bit cells within the row, to avoid shorting between the activation line and the select lines the activation line may be implemented by a conductor disposed in a different plane from the select lines within a substrate for the TCAM bit cell array, for example in a higher metal layer. One or more vertical via structures may be provided to couple the activation line to respective TCAM bit cells to receive the output value.

Some aspects relate to operation of the CIM device to perform MAC calculations. One aspect is directed to programming of weights in the weight matrix into SRAMs of the TCAM bit cell array based on the MAC operation to be performed. In some embodiments, an input activation value in the input activation vector is provided to different rows of TCAM bit cells. Because each TCAM bit cell provides two SRAMs storing two weights, multiplication with the two weights may be performed in a time-multiplexed manner, In one example, a controller may cause two multiplications to be performed in different non-overlapping phases within one clock cycle. In such an example, addition of the time-multiplexed output value may be performed in a clock cycle after the multiplications are completed.

In some embodiments, the CIM device includes multiple sub-arrays or tiles of TCAM bit cell arrays. In one embodiment with a first tile placed above a second tile along the column direction, the CIM device includes an SRAM edge cell separating the two tiles such that the search lines between the neighboring first and second tiles can be made independent for provision of different input activation vectors. In such embodiment, the input activation vectors may be routed horizontally at a side of a tile by a routing circuit alongside one column of TCAM bit cells. In another embodiment, routing of input activation vectors may be provided using columns across different tiles. In such an embodiment, because search lines can be shared across neighboring tiles, no SRAM edge cell is needed between adjacent tiles and a higher array efficiency can be achieved.

Some aspects may use an existing foundry design for a TCAM bit cell with no or minimal hardware changes, which can lower the cost of design and manufacturing for the disclosed CIM device.

Embodiments disclosed herein may be used for computation of neural networks in an artificial intelligence (AI) application, and some examples are described in detail below. It should be appreciated that the embodiments may also be used for other applications, such as but not limited to image processing, image classification, and identify human face using camera-captured images. In some embodiments, the CIM device is part of a mobile device.

The aspects and embodiments described above, as well as additional aspects and embodiments, are described further below. These aspects and/or embodiments may be used individually, all together, or in any combination of two or more, as the disclosure is not limited in this respect.

FIG. 1 is a schematic diagram of an exemplary neural network representation illustrating a MAC operation that may be performed using the CIM device disclosed herein. FIG. 1 shows an input activation vector (a0, a1, a2, a3) that may represent four input activation values from a previous layer. The neural network applies a weight matrix $$W = \begin{bmatrix} w0,0 & \ldots & w0,3 \\ \vdots & \ddots & \vdots \\ w3,0 & \ldots & w3,3 \end{bmatrix},$$

with each weight $w_{i,j}$ representing a weight for a corresponding input activation and neuron, respectively. The neural network generates an output activation vector (N0, N1, N2, N3) with four output values N0 . . . N3 for four corresponding neurons at the next layer based on a vector-matrix multiplication of the input activation vector with the weight matrix. The vector-matrix multiplication may be performed using a MAC operation. It should be appreciated that while FIG. 1 illustrates a square 4×4 weight matrix, it is merely for illustrative purposes only and the number of neurons in the previous layer may be different from the number of neurons in the next layer and the input activation vector and output activation vector may have any suitable size and/or dimensions.

Figure 2:
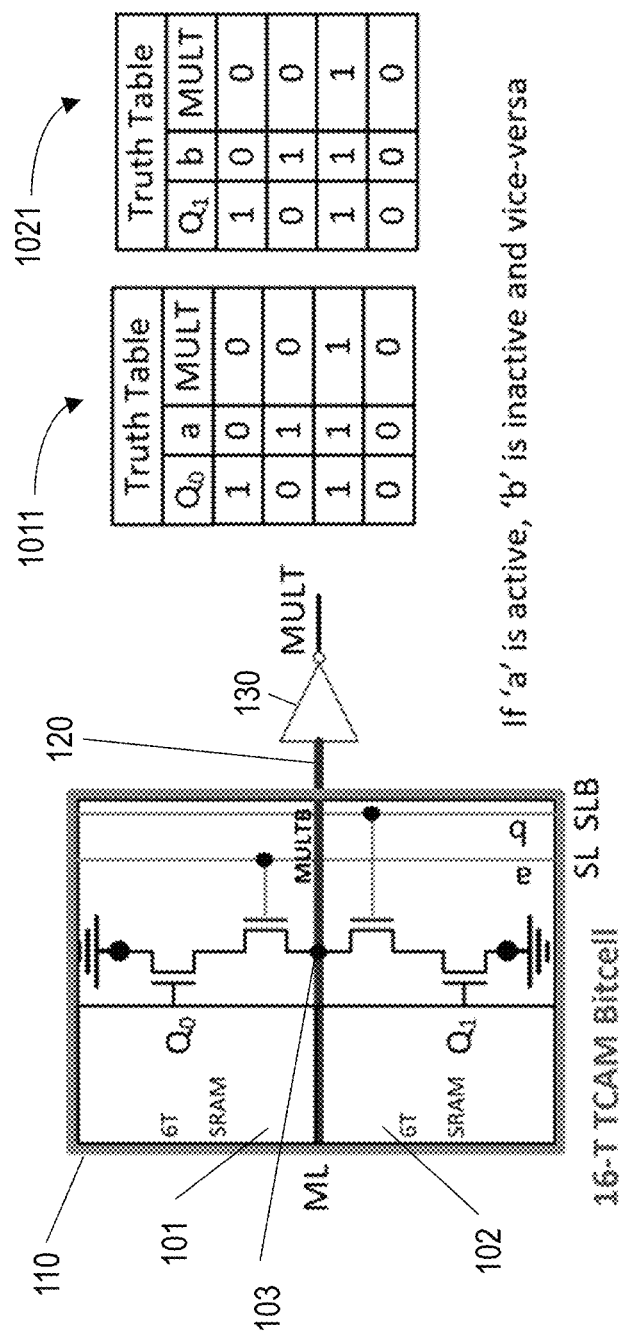
FIG. 2 is a schematic diagram illustrating an exemplary 16-transistor (16-T) TCAM bit cell that may be used in a CIM device to perform MAC operation, in accordance with some embodiments.

FIG. 2 is a schematic diagram illustrating an exemplary 16-transistor (16-T) TCAM bit cell that may be used in a CIM device to perform a MAC operation, in accordance with some embodiments. FIG. 2 shows a TCAM bit cell 110 that includes a first SRAM 101 and a second SRAM 102. TCAM bit cell 110 is a 16-T TCAM bit cell with each of SRAMs 101, 102 implemented as a 6-T SRAM. Although it should be appreciated that any foundry design of a TCAM bit cell that is now known or future-developed may also be used for TCAM bit cell 110, as aspects of the present disclosure are not so limited.

As shown in FIG. 2, any known technique for programming a TCAM bit cell 110 may be used to store charges $Q_0$ and $Q_1$ on SRAMs 101, 102, with the bit value of $Q_0$ and $Q_1$ representing two weight values of a weight matrix. First SRAM 101 receives a first input value from a first search line SL, while SRAM 102 receives a second input value b from a second search line SLB. The inventors have recognized and appreciated that each SRAM 101, 102 can be operated as an independent multiplier of an input value with the stored charge, with an output value provided at a common output node 103 shared by both SRAM 101 and SRAM 102. For example, an inverted output node MULT is coupled to common output node 103 via an inverter 130. As shown in the truth table 1011 in FIG. 2, the bit value of MULT represents a product of the first input value a with the weight $Q_0$ of the first SRAM. For example, MULT is only 1 when both first input value a and weight $Q_0$ are 1. As shown in the truth table 1021 in FIG. 2, the bit value of MULT represents a product of the second input value b with the weight $Q_1$ of the second SRAM. While the truth tables in FIG. 2 illustrate multiplication with a single bit weight $Q_0$ and $Q_1$, multi-bit multiplication may also be available, such as by storing a multi-bit value in a capacitor in an SRAM.

According to an aspect, when TCAM 110 is used in a CIM device, input values a and b are applied to SL and SLB independently such that both SRAMs 101, 102 can perform an independent multiplication. This operation differs from some non-CIM operations using a TCAM for e.g. memory storage or searching, where SL and SLB may not be operated independently of each other. Any suitable techniques for independently controlling routing of different input values to SL and SLB may be used. In one example, input values may be provided sequentially, or in a time multiplexed manner such that during a time period only one multiplying operation is performed within TCAM 110.

FIG. 2 also shows activation line 120 extending horizontally across both search lines SL and SLB in order to interconnect the common output node 103 to the input to inverter 130. In some embodiments, to avoid shorting between activation line 120 and search lines SL and SLB, activation line 120 is implemented as a conductor ML extending in a metal layer that is in a different plane offset from a plane in which search lines SL and SLB are disposed, and parallel to a surface of a semiconductor substrate for TCAM 110. In one non-limiting example, activation line 120 is disposed in the M3 metal layer. In embodiments where TCAM 110 is reusing an existing foundry TCAM design, activation line 120 may be added without significantly adding cost or complexity to the circuit design of the overall memory array.

Figure 3A:
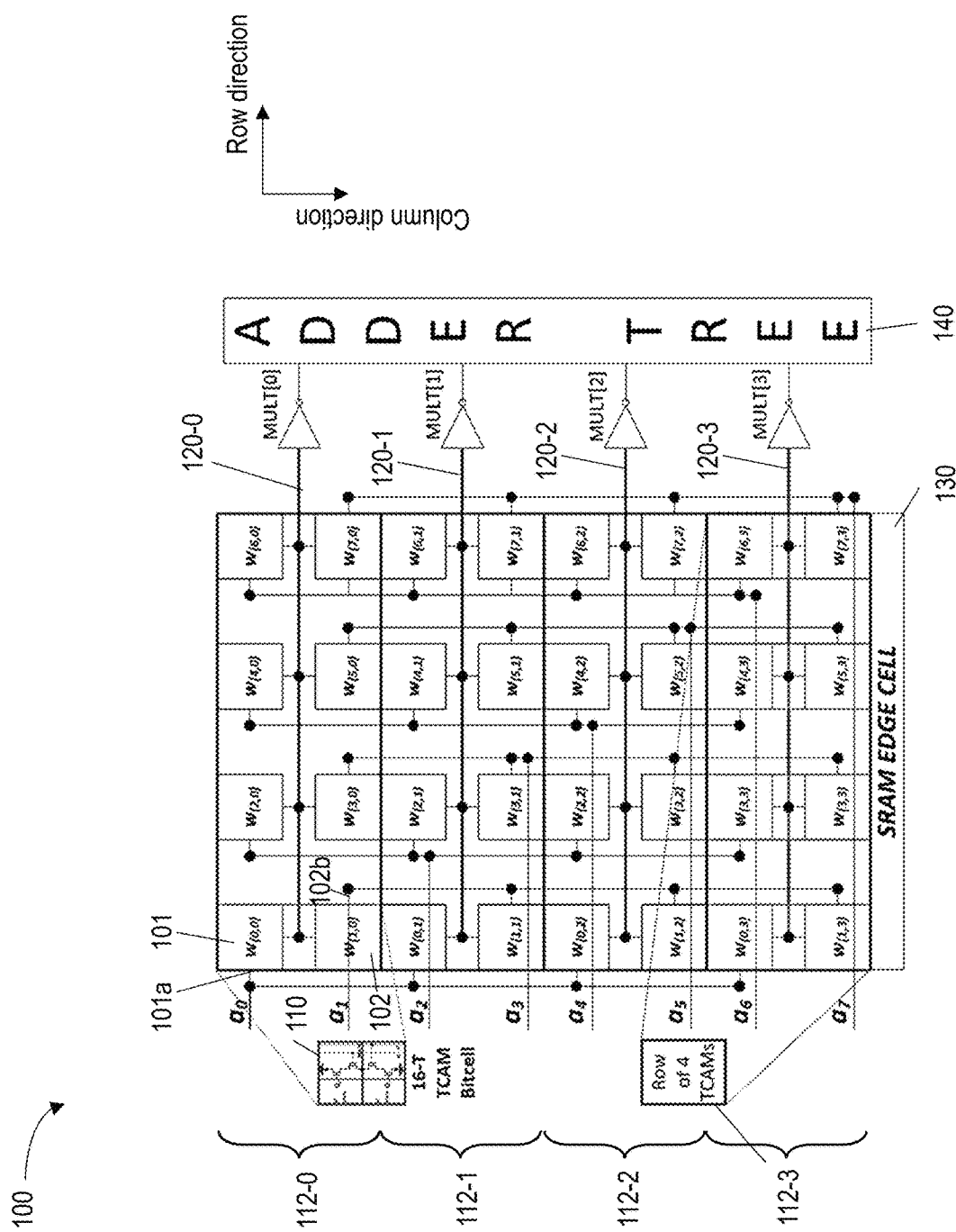
FIG. 3A is a schematic diagram of a CIM device architecture using an array of TCAM memory bit cells, in accordance with a first embodiment.

FIG. 3A is a schematic diagram of a CIM device architecture using an array of TCAM memory bit cells, in accordance with a first embodiment. FIG. 3A shows a CIM device 100 that includes an array of TCAM bit cells 110 arranged in four rows and four columns. Within the first row 112-0, output nodes of four TCAM bit cells are interconnected together to an activation line 120-0 that extends along the row direction. Activation line 120-0 is coupled to adder tree 140 via an inverter, and provides an inverted output MULT[0] to adder tree 140.

FIG. 3A illustrates an example of loading the weights of a weight matrix into different SRAM position of the TCAM bit cell array, as well as routing of the input activation values to perform a vector-matrix multiplication between an 8-bit input activation vector (a0, a1, . . . a7) with an 8×4 weight matrix $$\begin{bmatrix} w(0,0) & \cdots & w(0,3) \\ \vdots & \ddots & \vdots \\ w(7,0) & \cdots & w(7,3) \end{bmatrix}.$$

The TCAM bit cell array in FIG. 3A is configured to take 8 distinct input activation values a0, a1, . . . a7 that are routed alongside the leftmost column. Using the first row 112-0 for example, a first input activation value a0 is provided at search line 101a of first SRAM 101, which multiplies a0 with weight w(0,0). A second input activation value a1 is provided at search line 102b of second SRAM 102, which multiplies a1 with weight w(1,0). The results of the multiplications from both SRAMs 101, 102 are provided as output values to the activation line 120-0 as MULT[0]. Adder tree 140 is configured to receive the products a0·w(0,0) and a1·w(1,0) from MULT[0] and perform an accumulation operation accordingly.

Still referring to the first row 112-0 in in FIG. 3A, which illustrates the activation bus architecture of how each of the 8 SRAMs within the first row is coupled to one of the 8 input activation values output values a0, a1, . . . a7, respectively. During operation, the 8 input activation values are provided one at a time. For example, only the search line corresponding to one input activation value may be activated by a routing circuit, while search lines for the remaining 7 input activation values are disabled. The 8 products from SRAMs in the four TCAM bit cells in the first row 112-0 are represented in MULT[0]. The adder tree 140 may accumulate the products in MULT[0] to provide a MAC value N0 based on a0·w(0,0)+a1·w(1,0)+a2·w(2,0)+a3·w(3,0)+a4·w(4,0)+a5·w(5,0)+a6·w(6,0)+a7·w(7,0).

Still referring to FIG. 3A, which shows each of the remaining three rows 112-2, 112-2, 112-3 of TCAM bit cells is coupled to adder tree 140 via a corresponding activation line 120-1, 120-2, 120-3. Notably, each input activation value is only provided to one SRAM within each row, and an input activation value is provided to each of the four rows. As a result, four multiplication operations may be performed simultaneously in the four rows, and four MULT values may be output to the adder tree 140 in parallel.

Figures 1, 3B:
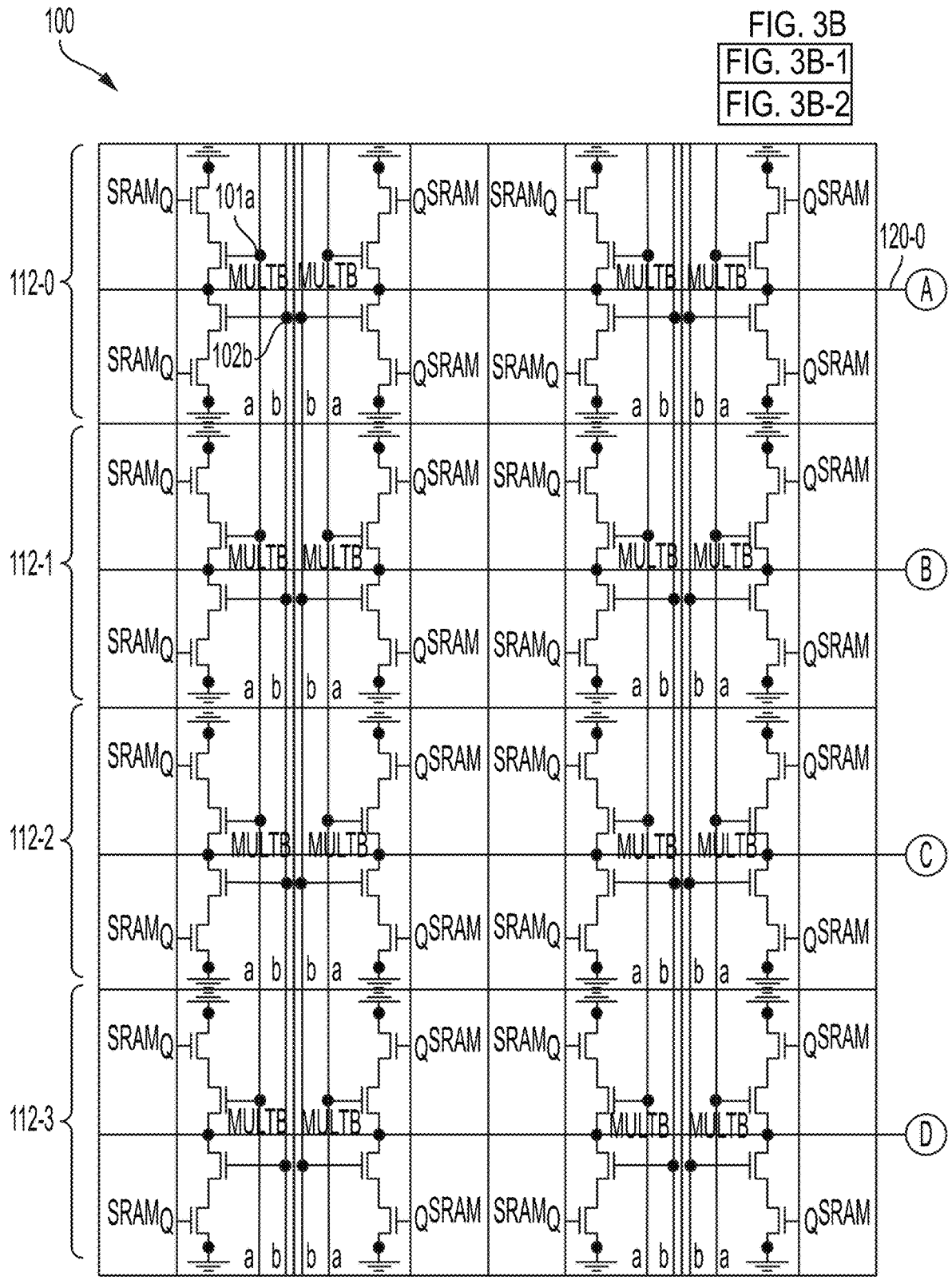
FIG. 3B is a schematic circuit diagram that shows the same CIM device shown in FIG. 3A, and with details of the SRAM circuitry within each TCAM bit cell and input activation bus architecture. Due to the large size of FIG. 3B in its entirety.
Figures 2, 3B:
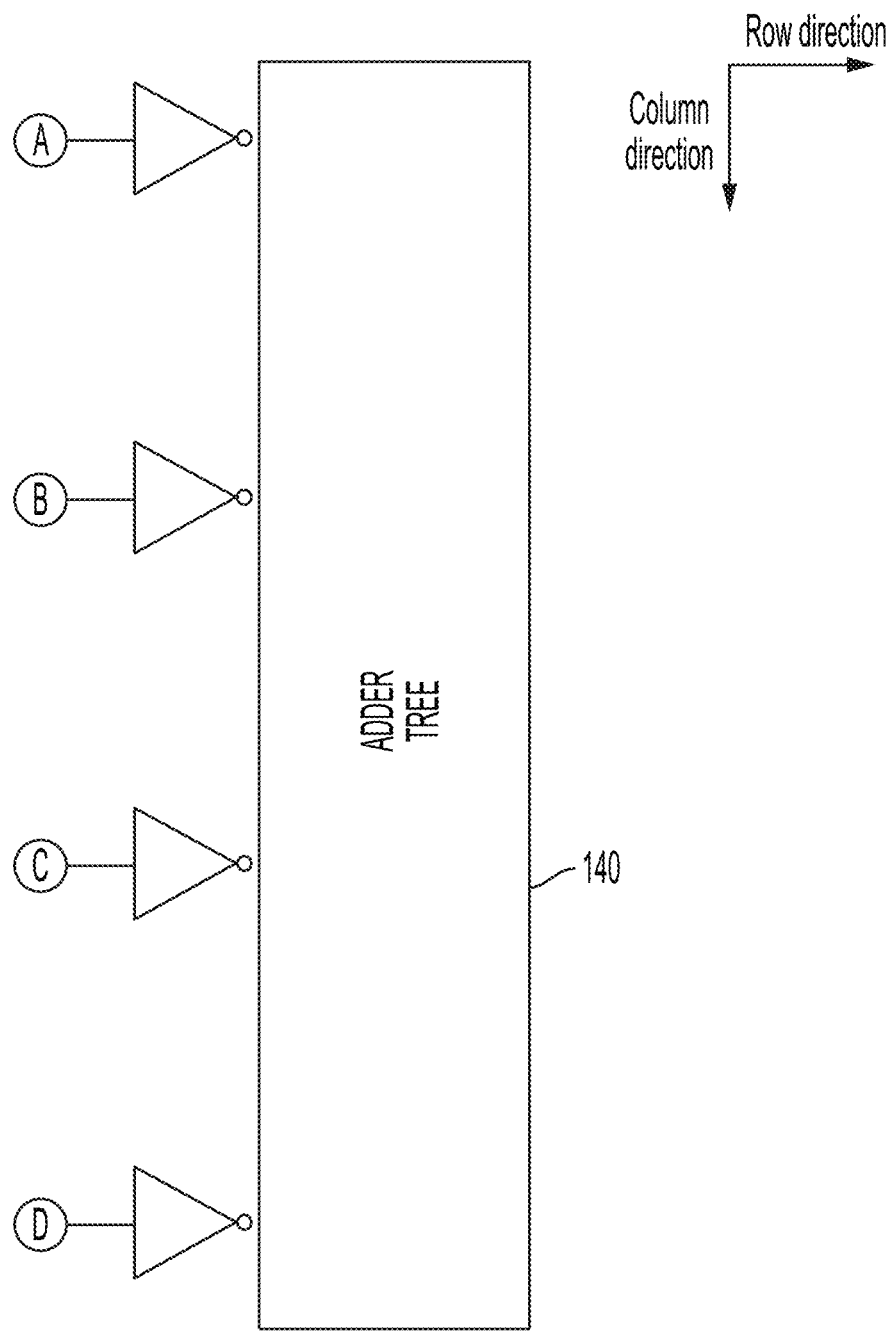

FIG. 3B is a schematic circuit diagram that shows the same CIM device shown in FIG. 3A, and with details of the SRAM circuitry within each TCAM bit cell and input activation bus architecture. For example, FIG. 3B illustrates that the first SRAM of the top left TCAM bit cell is coupled to first search line 101a, while the second SRAM of the same TCAM bit cell is coupled to second search line 102b.

The TCAM memory-based CIM device 100 may provide several advantages. The CIM array architecture is highly scalable to provide flexibility for application across different technical generations with different matrix and vector size requirements. For example, while FIG. 3A illustrates a MAC operation with an 8×4 weight matrix, the CIM device 100 may be extended to accommodate any size of weight matrices. For example, by adding 4 more rows of TCAM bit cell, an 8×8 weight matrix can be used. Similarly, a 16×4 weight matrix may be computed by extending each of the four rows to have 8 columns. The length of activation line 120-0 may be increased along the row direction to accommodate additional columns. A high number of multiplier units may be provided based on any suitable SRAM/TCAM read/write circuit architecture now known or future-developed to benefit from a high memory density of a TCAM bit cell array. Scaling may be provided, for example, by using more bit cell columns and rows within an array, and/or by using tiling of sub-arrays as described below.

Referring back to FIG. 3A, an SRAM edge cell 130 is provided below row 112-3. Edge cell 130 may provide electrical isolation between the four rows 112-0, 112-1, 112-3, 112-3 from additional circuitry such as additional rows of TCAM bit cells in a different tile positioned below the edge cell 130 as shown in FIG. 3A.

Figure 4A:
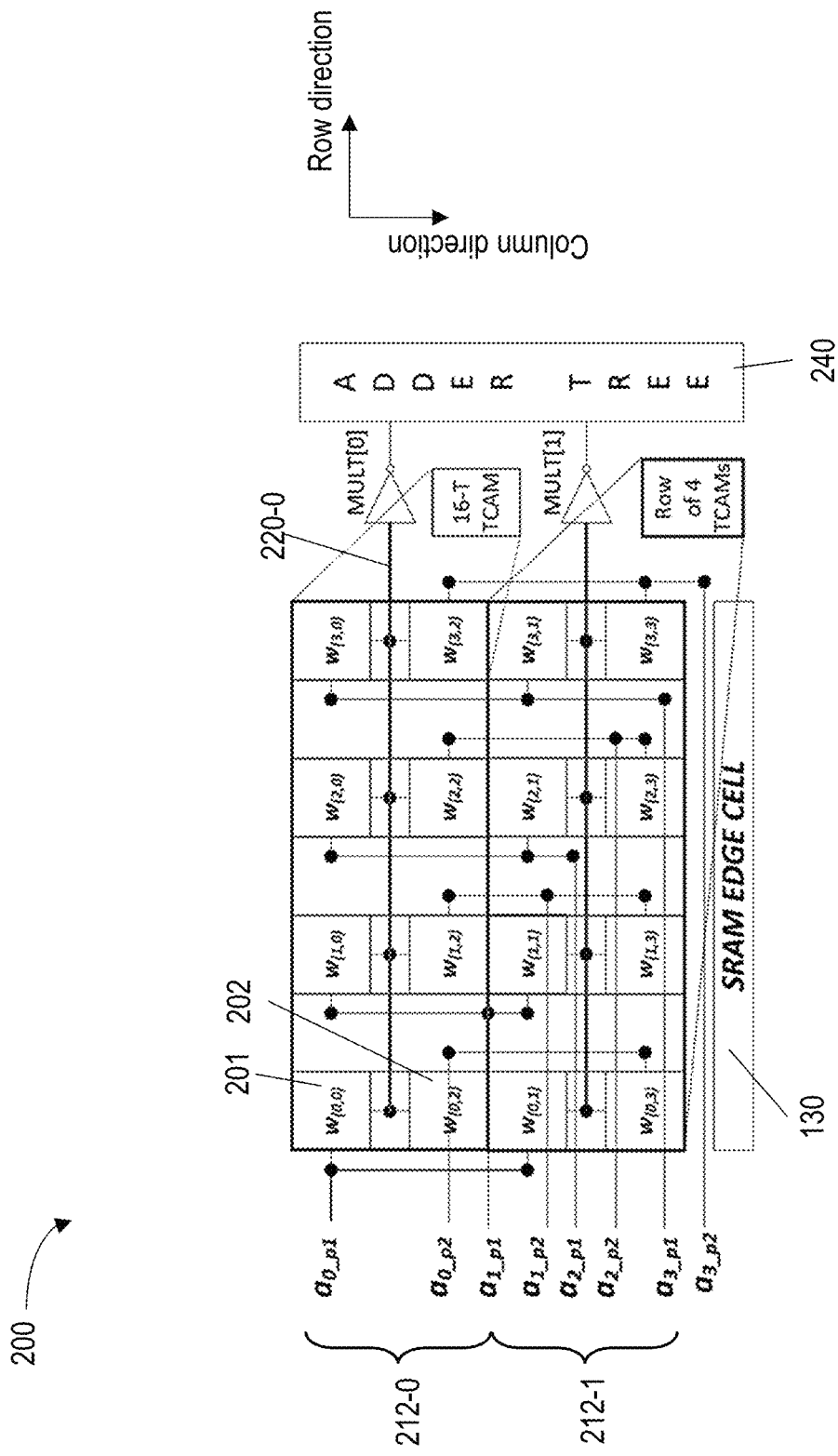
FIG. 4A is a schematic diagram of a CIM device architecture in which addition is performed in a time multiplexed fashion, in accordance with a second embodiment.

FIG. 4A is a schematic diagram of a CIM device architecture in which addition is performed in a time multiplexed fashion, in accordance with a second embodiment. FIG. 4A shows a CIM device 200 that has two rows 212-0, 212-1 of 4 TCAM bit cells within each row. In the first row 212-0, an activation line 220-0 is coupled to each of the TCAM bit cells to provide output values MULT[0] to adder tree 240.

CIM device 200 allows time-multiplexed multiplication of one input activation value such as a0 with different weights. As shown, product with a0 is configured to be performed in two phases $a_{0\_p1}$ and $a_{0\_p2}$. For example, $a_{0\_p1}$ is provided to w(0,0) in SRAM 201, while $a_{0\_p1}$ is provided to w(0,2) in SRAM 202 within the same row 212-0 as SRAM 201. The multiplication of $a_0 \cdot w(0,0)$ and $a_0 \cdot w(0,2)$ may be carried out at different times such as in two non-overlapping phases. This is illustrated in FIG. 4B, which is an exemplary timing diagram for operating the CIM device 200 as shown in FIG. 4A, in accordance with some embodiments.

Figure 4B:
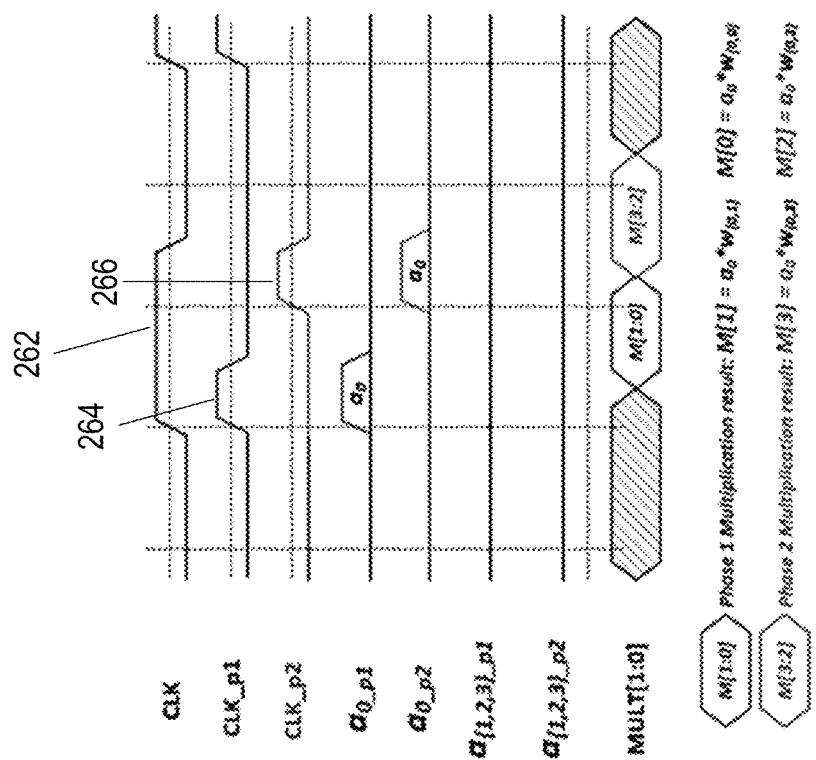
FIG. 4B is an exemplary timing diagram for operating the CIM device 200 as shown in FIG. 4A, in accordance with some embodiments.

FIG. 4B shows that the products $a_0 \cdot w(0,0)$ and $a_0 \cdot w(0,1)$ may be carried out in parallel during a first phase 264 of a clock period 262, in which $a_{0\_p1}$ is active and $a_{0\_p2}$ is disabled. Products $a_0 \cdot w(0,2)$ and $a_0 \cdot w(0,3)$ may be carried out during a second phase 266 of clock period 262, in which $a_{0\_p2}$ is active and $a_{0\_p1}$ is disabled. Clock period 262 may be a clock signal CLK provided by a circuit within CIM device 200, although any suitable timing signal may be used.

The weight matrix mapping in the second embodiment shown in FIG. 4A is also different from that of the first embodiment shown in FIG. 3A to accommodate the time-multiplexed operation. As such, unlike CIM device 100, multiplication output values of one input activation value a0 with different weights may be interconnected by a single activation line in CIM device 200, as opposed to multiple activation lines in CIM device 100. For example, in FIG. 4A, both $a_0 \cdot w(0,0)$ and $a_0 \cdot w(0,2)$ are interconnected to MULT[0] via activation line 220-0 in the first row, while the same products require two rows MULT[0] and MULT[2] in FIG. 3A. As such, the second embodiment can provide several advantages over the first embodiment. Because less number of rows are needed, the adder height on the semiconductor substrate along the column direction can be made more compact, leading to higher area utilization efficiency on the semiconductor substrate. As another advantage, because the SRAM for w(0,0) and w(0,2) are switched in different time phases, there are less number of bit cells switching at a given time. As a result, switching current may be spread out more evenly over time, leading to a lower average switching current and a reduction in local resistive IR voltage drop. Meanwhile, because the second embodiment conducts less computation in parallel, computation may be slower as compared to the first embodiment.

Figures 1, 5:
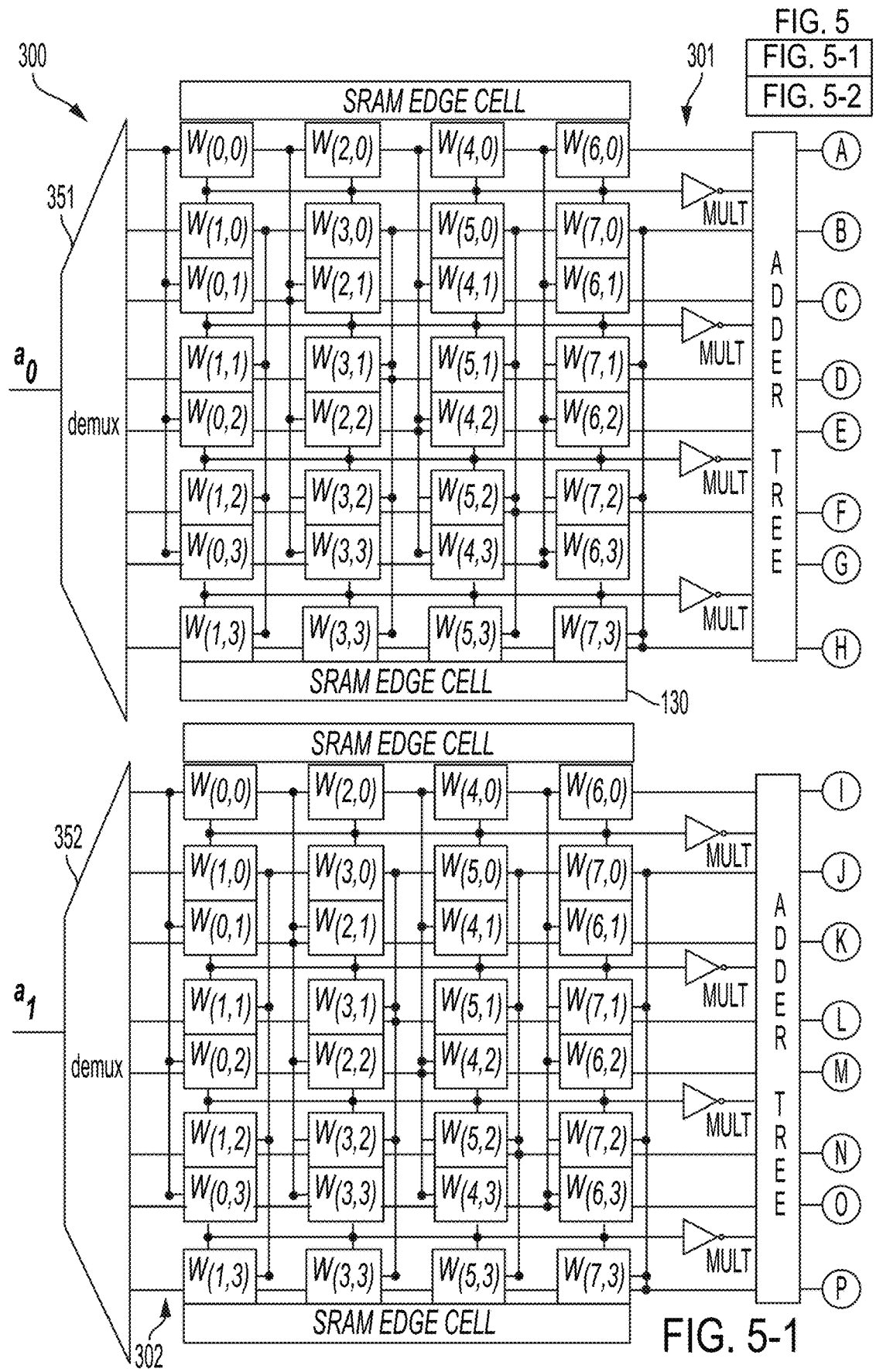
FIG. 5 is a schematic diagram of a CIM device having multiple tiles, in accordance with a third embodiment. Due to the large size of FIG. 5 in its entirety.
Figures 2, 5:
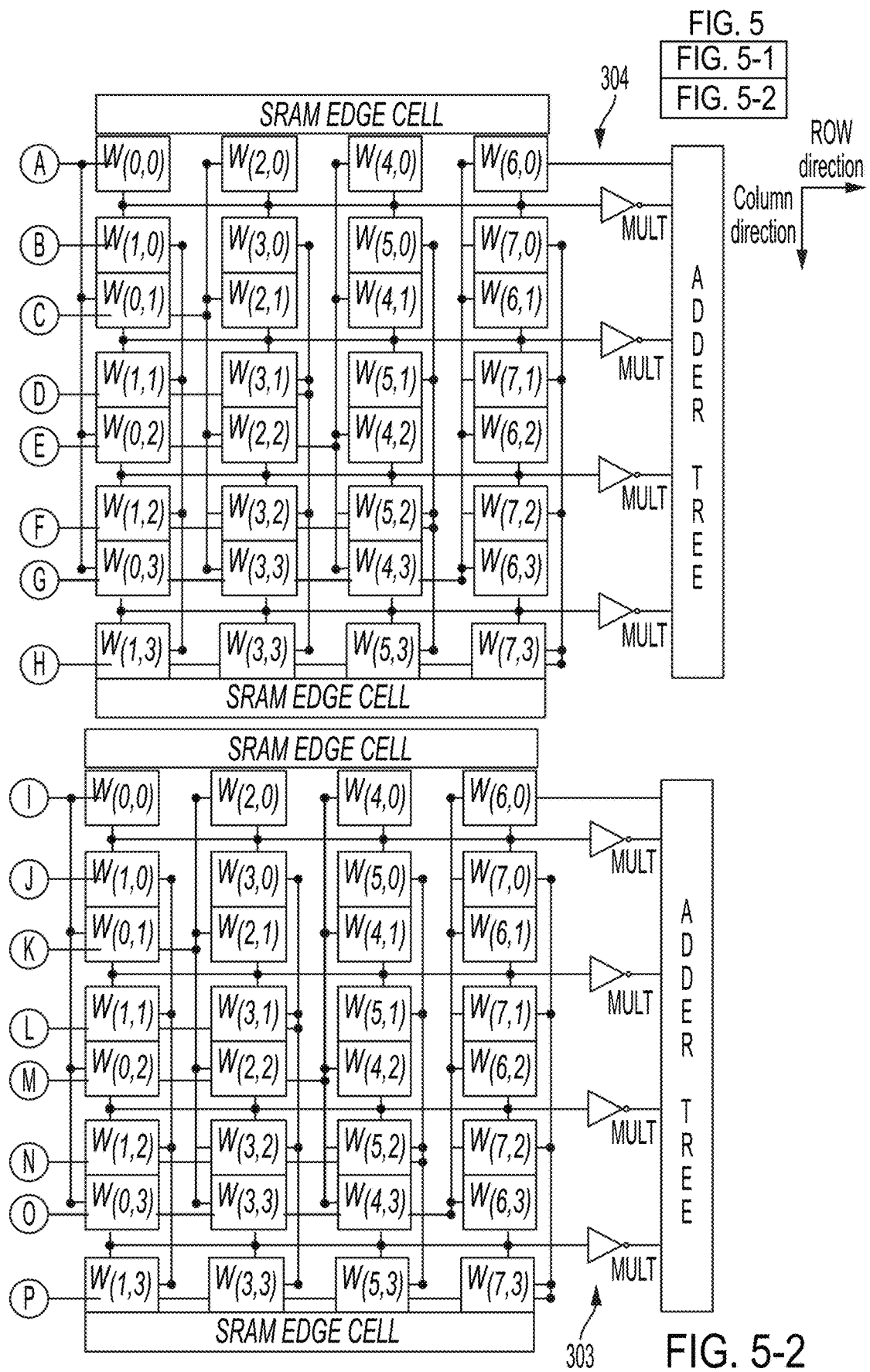

FIG. 5 is a schematic diagram of a CIM device having multiple tiles, in accordance with a third embodiment. As shown in FIG. 5, CIM device 300 comprises four tiles or sub-arrays 301, 302, 303, 304 of TCAM bit cells. Each tile may be similar to the TCAM bit cell array shown in FIG. 3A in many aspects. Activation input values a0 to tile 301 are routed via routing circuitry 351 positioned alongside a left edge of the tile 301 and parallel to a column direction. Activation input values a1 to tile 302 are routed via routing circuitry 352 positioned alongside a left edge of the tile 302 and parallel to a column direction. Tile 302 is positioned below tile 301, and is separated from tile 301 by one or more SRAM edge cells 130 to cut off the select lines in one tile from extending into a different tile so as to provide electrical isolation between the different activation inputs. The tiles may be implemented using the first embodiment as shown in FIG. 3A, the second embodiment as shown in FIG. 4A, a combination of the two embodiments, or any other suitable arrangement of a TCAM bit cell array.

In FIG. 5, routing circuitry 351 is a demultiplexer for steering a0 to one of the eight different inputs for input activation values based on for example a 3-bit control input signal transmitted to the demultiplexer from a controller (not shown). It should be appreciated that any suitable decoding circuitry for routing a signal to multiple inputs of another circuit may be used. In one example, routing circuitry 351 comprises a word-line decoder.

Figures 1, 6:
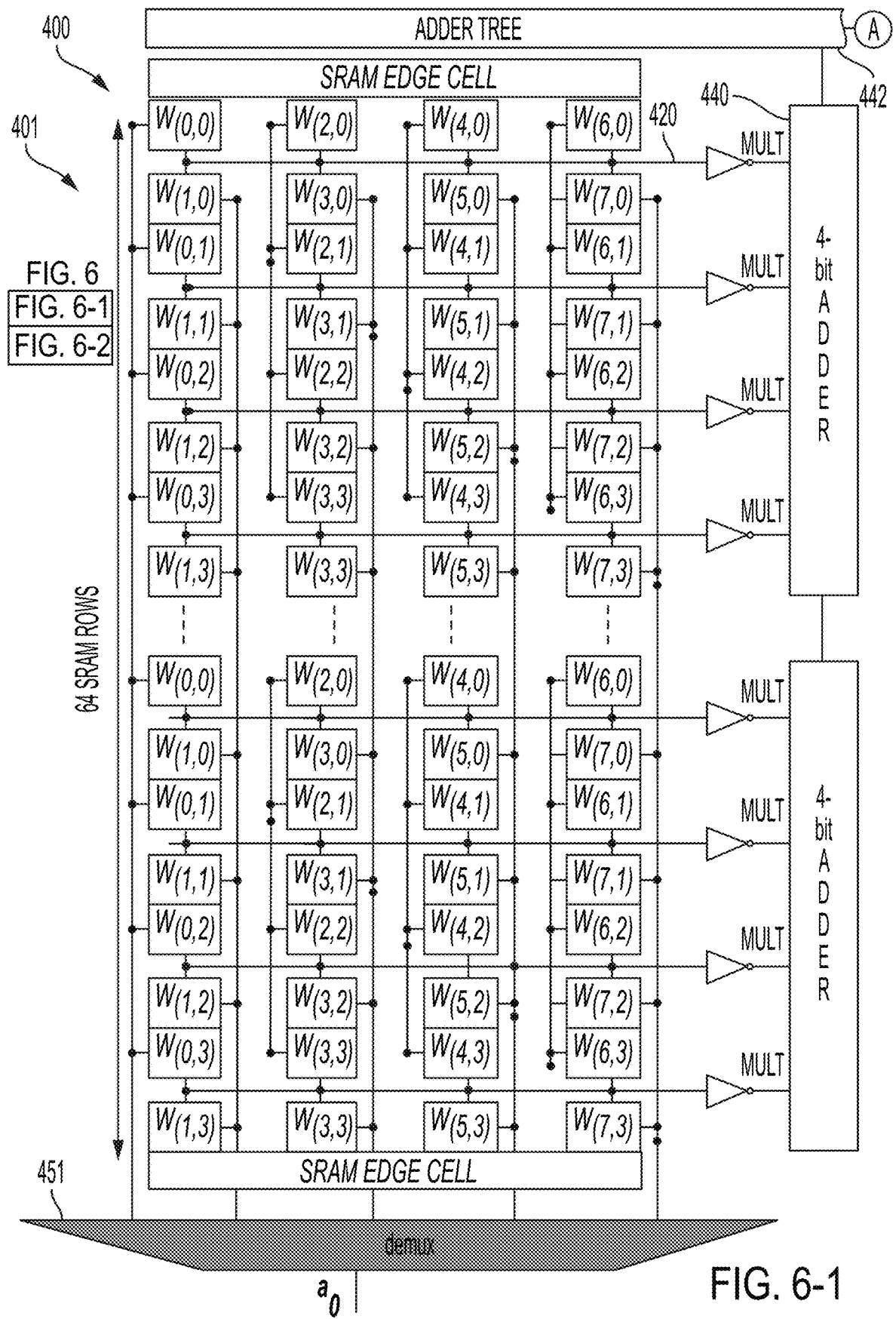
FIG. 6 is a schematic diagram of a CIM device having multiple tiles with a transposed input activation line routing scheme, in accordance with a fourth embodiment. Due to the large size of FIG. 6 in its entirety.
Figures 2, 6:
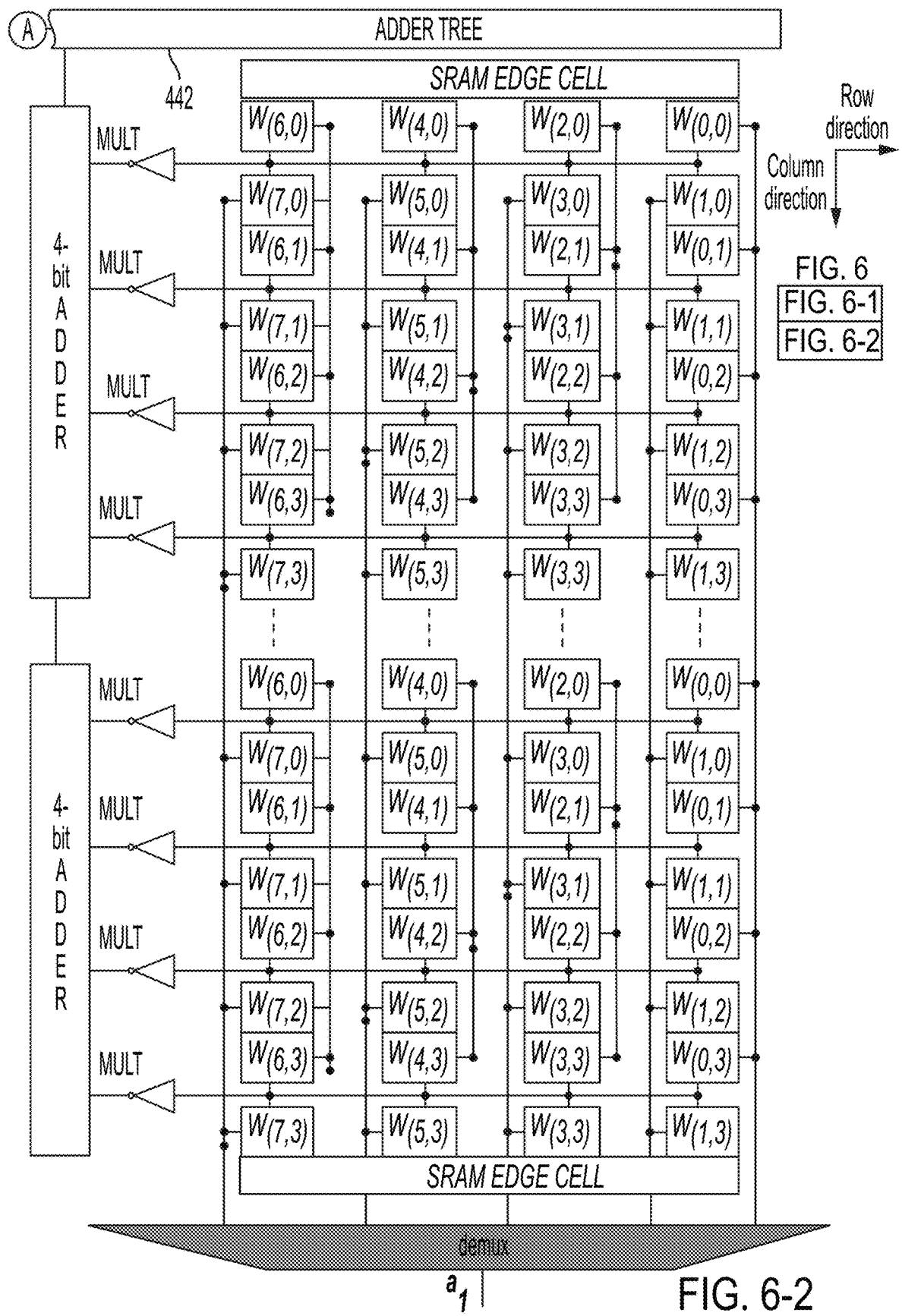

FIG. 6 is a schematic diagram of a CIM device having multiple tiles with a transposed input activation line routing scheme, in accordance with a fourth embodiment. As shown in FIG. 6, CIM device 400 differs from CIM device 300 in FIG. 5 in that input activation values are routed from below an array 401 with a routing circuit 451 positioned alongside a bottom row of the array 401. As a result of such a vertical routing of input lines, the array 401 of TCAM bit cells can extend vertically into multiple rows (such as 64 SRAM rows as shown) without being broken up into 8-bit or 4-bit sub-arrays separated by SRAM edge cells for isolation. Because the rows do not have SRAM edge cells in between and taking up space, this embodiment can greatly increase the area utilization efficiency.

The positioning of the weight matrix within array 401 may be programmed relative to the routing of the input activation values similarly to the first embodiment as shown in FIG. 3A, the second embodiment as shown in FIG. 4A, a combination of the two embodiments, or any other suitable arrangement of a TCAM bit cell array to provide MAC operation of an input activation vector with the weight matrix.

In FIG. 6, output values of each row of TCAM bit cells are interconnected by a horizontal activation line along the row direction to a 4-bit adder 440, which is in turn connected to an adder tree 442 configured to perform accumulation of values received by the 4-bit adders connected to the adder tree.

FIG. 7 is a schematic diagram of another variation of a CIM device having a continuous tile architecture, in accordance with a fifth embodiment. In FIG. 7, CIM device 500 includes continuous TCAM bit cell arrays 501, 502 that extends in the row and column directions. Routing of input activation vectors is provided by routing circuits 551 positioned below the array 501 and alongside a bottom row of the array 502. Similar to the embodiment in FIG. 6, such vertical routing of input data allows memory tiles to be stacked up along the column direction to provide 32, 64, 128, 256 or more rows per bit line. For output, an array of 4-bit adders 540 may be provided and arranged along the column direction, and accumulation is further provided by an adder/accumulator 542. Because the use of SRAM edge cells is minimized, the continuous tile architecture of FIG. 7 may achieve significant area utilization efficiency compared to the third embodiment in FIG. 5.

Figure 8:
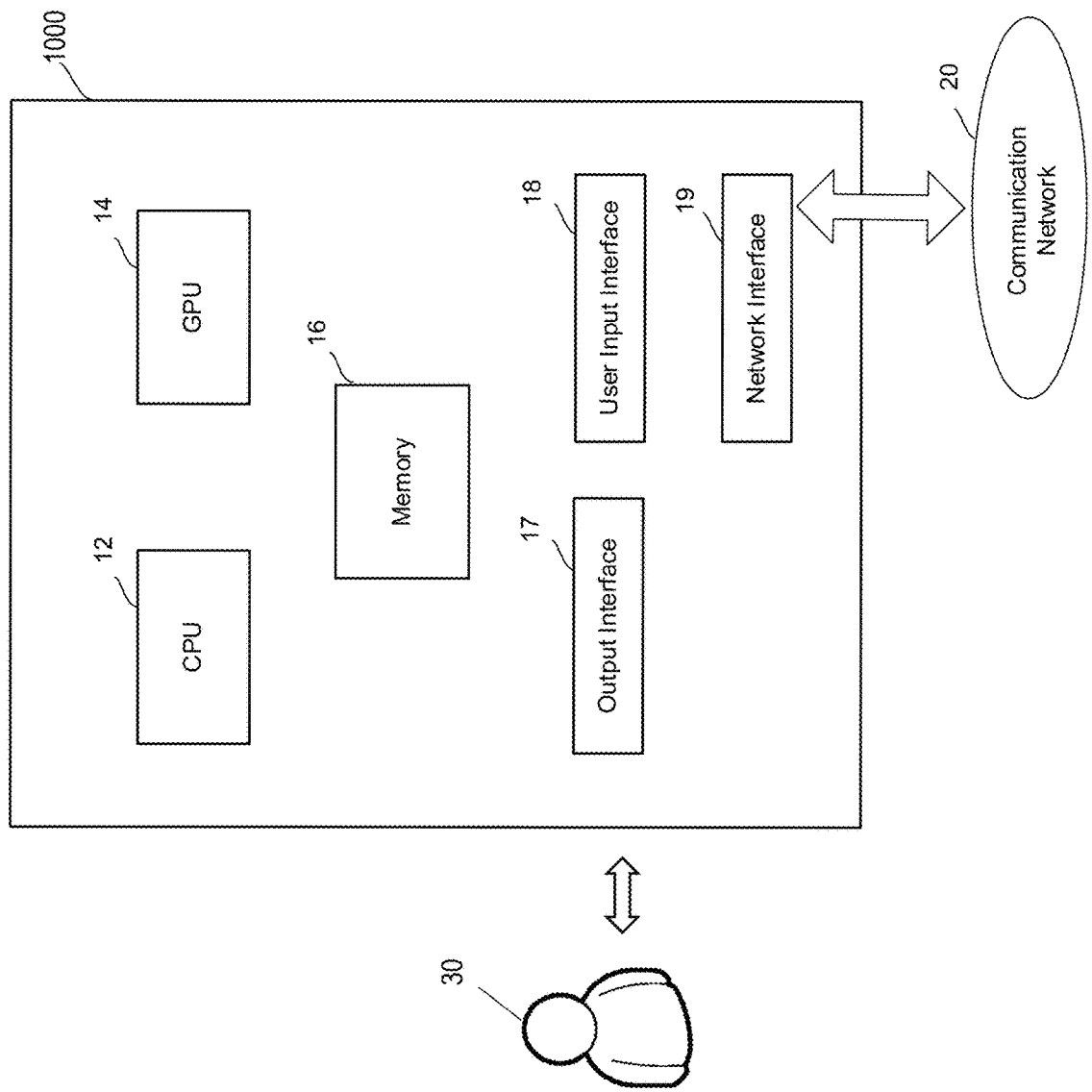
FIG. 8 is a high level block diagram that shows an illustrative computing device in which some embodiments can be practiced.

FIG. 8 is a high level block diagram that shows an illustrative computing device 1000 in which some embodiments can be practiced. In FIG. 8, computing device 1000 may be a desktop computer, a server, or a high-performance computing system such as a machine learning accelerator. Computing device 1000 may also be a portable, handheld, or wearable electronic device. Computing device 1000 may in some embodiments be a smartphone, a personal digital assistance (PDA), tablet computer, a smartwatch. Computing device 10 may be powered by a battery such as a rechargeable battery. Computing device 10 may also be a general purpose computer, as aspects of the present application are not limited to a portable device or a battery-powered device. Computing device 1000 may be a CIM device that can perform MAC operations according to any of the embodiments disclosed herein.

Computing device 1000 includes a central processing unit (CPU) 12 having one or more processors, a graphics processing unit (GPU) 14 having one or more graphics processors, and a non-transitory computer-readable storage medium 16 that may include, for example, volatile and/or non-volatile memory. The memory 16 may store one or more instructions to program the CPU 12 and/or GPU 14 to perform any of the functions described herein. Memory 16 may comprise one or more TCAM bit cell array that may perform MAC operation according to the disclosure above. Memory 16 may further include routing circuitry and one or more memory controllers configured to route input activation values and program operation of the adder tree.

The computing device 10 may have one or more input devices and/or output devices, such as user input interface 18 and output interface 17 as illustrated in FIG. 8. These devices can be used, among other things, to present a user interface. Examples of output interface that can be used to provide a user interface include printers or display screens for visual presentation of output, speakers or other sound generating devices for audible presentation of output, and vibratory or mechanical motion generators for presentation of tactile output. Examples of input interface that can be used for a user interface include keyboards and pointing devices, such as mice, touch pads, or digitizers for pen, stylus or finger touch input. As another example, the input interface 18 may include one or more microphones for capturing audio signals, one or more cameras and light sensors to capture visual signals, and the output interface 17 may include a display screen for visually rendering, and/or a speaker for audibly rendering, images or text to a user 30 of the computing device 10.

Also as shown in FIG. 8, the computing device 10 may comprise one or more network interfaces 19 to enable communication via various networks (e.g., the network 20). Examples of networks include a local area network or a wide area network, such as an enterprise network or the Internet. Such networks may be based on any suitable technology and may operate according to any suitable protocol and may include wireless networks, wired networks or fiber optic networks. Examples of network interfaces include Wi-Fi, WiMAX, 3G, 4G, 5G NR, white space, 802.11x, satellite, Bluetooth, near field communication (NFC), LTE, GSM/WCDMA/HSPA, CDMA1x/EVDO, DSRC, GPS, etc.) While not shown, computing device 10 may additionally include one or more high speed data buses that interconnect the components as shown in FIG. 8, as well as a power subsystem that provide electric power to the components.

The aspects and embodiments described above, as well as additional aspects and embodiments, are described further below. These aspects and/or embodiments may be used individually, all together, or in any combination of two or more, as the application is not limited in this respect.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A compute-in-memory device, comprising:
a memory array comprising a plurality of ternary content-addressable memory (TCAM) bit cells arranged in a plurality of rows, each TCAM bit cell comprising two static random-access memories (SRAMs), each SRAM configured to apply a weight stored therein to an input activation to generate an output value, wherein the plurality of TCAM bit cells of the compute-in-memory device are configured to store weights in a weight matrix of a neural network, each SRAM of the compute-in-memory device operates as a multiplier that performs an in-memory multiplication between the weight stored therein and the input activation, a first input activation that is multiplied by a first weight stored in one of the two SRAMs of said each TCAM bit cell is received from a first search line of a search line pair coupled to said each TCAM bit cell, a second input activation that is multiplied by a second weight stored in another of the two SRAMs of said each TCAM bit cell is received from a second search line of the search line pair coupled to said each TCAM bit cell, and a period in which a first in-memory multiplication between the first input activation and the first weight is performed does not overlap a period in which a second in-memory multiplication between the second input activation and the second weight is performed; and
a plurality of activation lines, each activation line interconnecting a row of the plurality of rows of TCAM bit cells and configured to receive output values from both SRAMs in each TCAM bit cell within the row.

2. The compute-in-memory device of claim 1, further comprising:
an adder having a plurality of adder inputs each coupled to an activation line of the plurality of activation lines, the adder configured to generate a multiply-and-accumulate (MAC) value based on the output values of the SRAMs.

3. The compute-in-memory device of claim 1, wherein each TCAM bit cell of the plurality of TCAM bit cells comprises:
a first SRAM, configured to store the first weight in the weight matrix of the neural network;
a second SRAM, configured to store the second weight in the weight matrix of the neural network;
a first transistor, comprising:
a first connection terminal, configured to receive a reference voltage;
a control terminal, coupled to the first SRAM and configured to receive the first weight stored in the first SRAM; and
a second connection terminal;
a second transistor, comprising:
a first connection terminal, coupled to the second connection terminal of the first transistor;
a control terminal, coupled to the first search line and configured to receive the first input activation from the first search line; and
a second connection terminal;
a third transistor, comprising:
a first connection terminal, coupled to the second connection terminal of the second transistor;
a control terminal, coupled to the second search line and configured to receive the second input activation from the second search line; and
a second connection terminal; and
a fourth transistor, comprising:
a first connection terminal, coupled to the second connection terminal of the third transistor;
a control terminal, coupled to the second SRAM and configured to receive the second weight stored in the second SRAM; and
a second connection terminal, configured to receive the reference voltage.

4. The compute-in-memory device of claim 1, further comprising a plurality of inverters, wherein each activation line is coupled to a corresponding adder input via an inverter of the plurality of inverters.

5. The compute-in-memory device of claim 1, wherein the TCAM bit cells within the array are 16-transistor (16-T) TCAM bit cells.

6. The compute-in-memory device of claim 1, wherein the memory array is configured to receive a vector of input activations and the weight matrix of weights.

7. The compute-in-memory device of claim 6, wherein an input activation of the vector of input activations is provided to two or more different rows of TCAM bit cells.

8. The compute-in-memory device of claim 6, wherein the vector of input activations is received in a time-multiplexed manner.

9. The compute-in-memory device of claim 1, wherein within each SRAM the output value is based on a multiplication of the weight and the input activation.

10. The compute-in-memory device of claim 3, wherein the memory array defines a first plane, the first search line is disposed in a second plane parallel to the first plane, and the plurality of activation lines comprise a conductor disposed in a third plane parallel to and offset from the second plane.

11. The compute-in-memory device of claim 3, wherein the plurality of TCAM bit cells are arranged in a plurality of columns, and the compute-in-memory device further comprises:
a routing circuit alongside a column of the plurality of columns and configured to route input activations to some or all of the plurality of TCAM bit cells.

12. The compute-in-memory device of claim 11, further comprising an SRAM edge cell disposed alongside a row of the plurality of TCAM bit cells.

13. The compute-in-memory device of claim 12, wherein the memory array comprises a first sub-array and a second sub-array positioned below the first sub-array along a column direction, wherein the SRAM edge cell is disposed between the first sub-array and the second sub-array.

14. The compute-in-memory device of claim 3, further comprising:
a routing circuit alongside a row of the plurality of rows and configured to route input activations to some or all of the plurality of TCAM bit cells.

15. The compute-in-memory device of claim 14, wherein the memory array comprises a first sub-array and a second sub-array positioned below the first sub-array along a column direction without an SRAM edge cell between the first sub-array and the second sub-array.

16. A method for operating a ternary content-addressable memory TCAM) cell array to perform a multiply-and-accumulate (MAC) operation of a vector of input activations with a weight matrix of weights, wherein TCAM cells in the TCAM cell array are arranged in a plurality of rows and each comprising two static random-access memories (SRAMs), the method comprising:
  storing the weights in the weight matrix of a neural network in the SRAMs within the TCAM cell array, wherein the TCAM cell array is used as a compute-in-memory device;
  multiplying, with the SRAMs, the vector of input activations to the weights to produce a plurality of output values, wherein each SRAM operates as a multiplier that performs an in-memory multiplication between a weight stored therein and an input activation of the vector of input activations, a first input activation that is multiplied by a first weight stored in one of the two SRAMs of a same TCAM cell is received from a first search line of a search line pair coupled to the same TCAM cell, a second input activation that is multiplied by a second weight stored in another of the two SRAMs of the same TCAM cell is received from a second search line of the search line pair coupled to the same TCAM cell, and a period in which a first in-memory multiplication between the first input activation and the first weight is performed does not overlap a period in which a second in-memory multiplication between the second input activation and the second weight is performed;
  collecting output values from both SRAMs in each TCAM cell of a row of the plurality of rows with an activation line; and
  summing the output values from the activation line to generate a MAC value.

17. The method of claim 16, wherein summing the output values from the activation line comprises coupling the activation line to an adder tree.

18. The method of claim 16, wherein the act of multiplying is performed in a time-multiplexed manner.

19. The method of claim 16, wherein the act of multiplying comprises:
  providing the first weight stored in a first SRAM in a TCAM cell to a control terminal of a first transistor, wherein the first weight is included in the weight matrix of the neural network, and a first connection terminal of the first transistor receives a reference voltage;
  providing a control terminal of a second transistor with the first input activation from the first search line of the TCAM cell, wherein a first connection terminal of the second transistor is coupled to a second connection terminal of the first transistor;
  providing a control terminal of a third transistor with the second input activation from the second search line of the TCAM cell, wherein a first connection terminal of the third transistor is coupled to a second connection terminal of the second transistor; and
  providing the second weight stored in a second SRAM in the TCAM cell to a control terminal of a fourth transistor, wherein the second weight is included in the weight matrix of the neural network, a first connection terminal of the fourth transistor is coupled to a second connection terminal of the third transistor, and a second connection terminal of the fourth transistor receives the reference voltage.

20. The method of claim 19, wherein the act of multiplying further comprises:
  providing the first input activation to SRAMs in two or more different rows of TCAM cells of the plurality of rows.

* * * * *